US008878196B2

(12) United States Patent
Choi et al.

(10) Patent No.: US 8,878,196 B2
(45) Date of Patent: Nov. 4, 2014

(54) LIGHT-EMITTING DEVICE COMPRISING SEMICONDUCTOR NANOCRYSTAL LAYER FREE OF VOIDS AND METHOD FOR PRODUCING THE SAME

(75) Inventors: Byoung Lyong Choi, Seoul (KR); Byung Ki Kim, Gunpo-Si (KR); Kyung Sang Cho, Gwacheon-Si (KR); Soon Jae Kwon, Seongnam-Si (KR); Jae Young Choi, Suwon-Si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/985,873

(22) Filed: Jan. 6, 2011

(65) Prior Publication Data

US 2011/0101303 A1 May 5, 2011

Related U.S. Application Data

(63) Continuation of application No. 11/390,851, filed on Mar. 28, 2006, now abandoned.

(30) Foreign Application Priority Data

Sep. 27, 2005 (KR) .................. 2005-90082

(51) Int. Cl.
*H01L 27/15* (2006.01)
*B82Y 30/00* (2011.01)
*H01L 51/50* (2006.01)
*B82Y 20/00* (2011.01)
*H01L 33/18* (2010.01)
*H01L 33/08* (2010.01)

(52) U.S. Cl.
CPC ............ *H01L 51/5012* (2013.01); *B82Y 30/00* (2013.01); *H01L 33/18* (2013.01); *H01L 33/08* (2013.01); *B82Y 20/00* (2013.01)

USPC ..................................... 257/79; 257/E33.063

(58) Field of Classification Search
CPC .................................. H01I 39/32; H01I 33/20
USPC ............................................. 257/79, E33.063
See application file for complete search history.

(56) References Cited

U.S. PATENT DOCUMENTS

| 2001/0000335 A1* | 4/2001 | Yamada et al. ................. 438/1 |
| 2003/0072126 A1* | 4/2003 | Bhattacharyya .............. 361/311 |
| 2004/0023010 A1* | 2/2004 | Bulovic et al. ................ 428/209 |
| 2005/0274944 A1* | 12/2005 | Jang et al. ....................... 257/40 |

FOREIGN PATENT DOCUMENTS

| KR | 10-1999-0086981 | 12/1999 |
| KR | 10-2000-0011914 | 2/2000 |
| KR | 10-2001-0029991 | 4/2001 |

OTHER PUBLICATIONS

Office Action—Korean Application No. 10-2005-0090082 issued from Korean Intellectual Patent Office (KIPO) dated Jun. 21, 2011.

* cited by examiner

*Primary Examiner* — Dale E Page
(74) *Attorney, Agent, or Firm* — Cantor Colburn LLP

(57) ABSTRACT

A light-emitting device including a semiconductor nanocrystal layer and a method for producing the light-emitting device are provided. The light-emitting device includes a semiconductor nanocrystal layer whose voids are filled with a filling material. According to the light-emitting device, since voids formed between nanocrystal particles of the semiconductor nanocrystal layer are filled with a filling material, the occurrence of a current leakage through the voids is minimized, which enables the device to have extended service life, high luminescence efficiency, and improved stability.

16 Claims, 7 Drawing Sheets

PRIOR ART

LIGHT-EMITTING DEVICE COMPRISING SEMICONDUCTOR NANOCRYSTAL LAYER FREE OF VOIDS AND METHOD FOR PRODUCING THE SAME

This application is a continuation of U.S. patent application Ser. No. 11/390,851, filed on Mar. 28, 2006, which claims priority to Korean Patent Application No. 2005-90082, filed on Sep. 27, 2005 and all the benefits accruing therefrom under 35 U.S.C. §119, and the contents of which in its entirety are herein incorporated by reference.

BACKGROUND OF THE INVENTION

1. Field of the Invention

The present invention relates to a light-emitting device having a semiconductor nanocrystal layer and a method for producing the light-emitting device. More particularly, the present invention relates to a light-emitting device having a semiconductor nanocrystal layer whose voids are filled with a filling material, and a method for producing the light-emitting device.

2. Description of the Related Art

The control over the size of semiconductor nanocrystals exhibiting quantum confinement effects and enables control of electrical and optical properties of the nanocrystals. Based on this characteristic, semiconductor nanocrystals are applied to a variety of devices, including light-absorbing devices and light-emitting devices. To exhibit inherent characteristics of nanocrystals in various devices, it is necessary to uniformly arrange and form the nanocrystals into a thin film. However, since nanocrystals have a strong tendency toward aggregation between the nanocrystal particles to form aggregates due to their inherent characteristics, the nanocrystals are not formed into monolayers and empty spaces (i.e. voids) not occupied by the nanocrystals remain within nanocrystal layers.

When empty spaces are present between the nanocrystal particles of a nanocrystal layer used as a light-emitting layer in an electroluminescence device, holes do not combine with electrons at the nanocrystal particles to form excitons, and as a result, light emission is not achieved and current leakage occurs.

A detailed explanation thereof is suggested with reference to FIG. 1. FIG. 1 is a cross-sectional view schematically showing the structure of an electroluminescence device using a nanocrystal layer with voids as a light-emitting layer.

As shown in FIG. 1, the electroluminescence device 600 includes an anode 100, a hole transport layer 200, a semiconductor nanocrystal layer 300, an electron transport layer 400, and a cathode 500. When a voltage is applied to the device, the anode 100 injects holes, such as along paths 700, into the hole transport layer 200 and the cathode 500 injects electrons, such as along paths 800, into the electron transport layer 400, such that the holes meet the electrons as shown by 900, thus defining regions where excitons are recombined to emit light. The injected holes and electrons migrate toward the oppositely charged electrodes 500 and 100 and are concentrated at a semiconductor nanocrystal 310 to form excitons, after which the excitons are recombined to emit light. However, when the electrons meet the holes at voids 320 of the semiconductor nanocrystal layer 300, the electrons are directly bonded to the holes and current leakage is caused, leading to a reduction in the luminescence efficiency of the light-emitting device. In addition, since the resistance at the voids 320 is extremely low, a large amount of current is concentrated on the voids 320 by Ohm's law, thus shortening the service life of the device and causing poor electrical stability of the device.

To solve these problems, attempts have been made to reduce the volume of empty spaces formed within nanocrystal layers by increasing the coverage of nanocrystals on the nanocrystal layers. However, conventional processes have not been successful in the production of nanocrystal thin films free of empty spaces in view of their inherent characteristics.

One exemplary process for producing nanocrystal thin films is a Langmuir-Blodgett ("LB") process wherein thin films are formed at the interface between an aqueous solution and air. However, since the Langmuir-Blodgett process utilizes weak van der Waals interactions between particles or between particles and substrates, the transfer ratio, a value representing the degree of transfer of particles to substrates, is not higher than 1. This low transfer ratio causes occurrence of a large number of defects on nanocrystal thin films and makes it impossible to produce uniform monolayers.

Another example is a dipping process wherein a substrate is repeatedly dipped in an aqueous solution of particles to increase the coverage of the particles adsorbed to the substrate. This process, however, has a problem that the coverage is limited to a maximum of 70% despite the repeated dipping.

Another example is an electrostatic self assembly process wherein particles and a substrate are oppositely charged to form a thin film. Since this process, in practice, causes the formation of nanoparticle aggregates, which leads to the occurrence of defects, it is disadvantageous in terms of degree of completeness.

In addition to the aforementioned processes, pyrolysis, laser ablation, and chemical vapor deposition ("CVD") are known wherein nanoparticles are directly formed on a substrate through a vapor phase reaction using raw materials supplied in a gaseous state and grown by filling to arrange the nanoparticles on the substrate. However, these processes are not suitable for the production of uniform monolayers in which nanocrystals are uniformly applied.

A detailed explanation thereof is suggested with reference to FIG. 2. FIG. 2 is a transmission electron microscopy ("TEM") image of a nanocrystal (PbSe) thin film produced by spin coating. The image shows that many irregular voids are present between PbSe nanocrystal particles on the PbSe thin film. At this time, the coverage of the nanocrystal on a substrate is about 91%. That is, the nanocrystal thin film contains a number of voids. When the nanocrystal thin film having voids is used to produce an electroluminescence device, a large amount of current is concentrated on the voids, thus shortening the service life of the device and damaging the electrical stability of the device.

Some electroluminescence devices using nanocrystals as light-emitting materials are known.

For example, U.S. Patent Publication No. 2004/0023010 teaches an electroluminescence device comprising a plurality of semiconductor nanocrystals dispersed therein, however, the presence of voids between the nanocrystals and current leakage arising from the voids is not described.

Korean Patent Laid-open No. 2005-7661 discloses a method for forming metal oxide quantum dots by mixing an insulator precursor and a nanometer-sized metal powder and annealing the mixture, and a polymer thin film containing the metal oxide quantum dots dispersed therein. Although the quantum dots and an insulator coexist in the polymer thin film, the quantum dots are not formed into a monolayer but are three-dimensionally randomly arranged with the insulator in the polymer thin film. Accordingly, in the case where the polymer thin film is used as a light-emitting layer of an electroluminescence device, the luminescence efficiency of the device is considerably low, making the polymer thin film unsuitable for the production of light-emitting devices.

Korean Patent Laid-open No. 2004-98798 discloses a high-luminance light-emitting device including an active layer made of quantum dots. This patent publication describes the presence of a dielectric layer formed on the active layer made of quantum dots. However, no mention is made in the publication regarding the presence of voids between the quantum dots and current leakage arising from the voids.

As described above, the prior art light-emitting devices containing nanocrystals have focused on increasing the coverage of the nanocrystals, however a light-emitting device having a semiconductor nanocrystal layer exhibiting high efficiency and excellent electrical stability has not been obtained.

BRIEF SUMMARY OF THE INVENTION

Accordingly, exemplary embodiments of the present invention provide a light emitting device having a semiconductor nanocrystal layer exhibiting high efficiency and excellent electrical stability by filling voids of the semiconductor nanocrystal layer with a filling.

In exemplary embodiments of the present invention, a light-emitting device includes a semiconductor nanocrystal layer whose voids are filled with a filling material so as to prevent occurrence of a current leakage through the voids and reduce the amount of an operating current, thereby enabling the device to have extended service life and high efficiency.

In other exemplary embodiments of the present invention, a light-emitting device includes a semiconductor nanocrystal layer whose voids are filled with a filling material so as to simplify the interfaces between the nanocrystal layer and its adjacent layers due to packaging effects arising from the filling, thereby enabling the device to have enhanced stability.

In other exemplary embodiments of the present invention, a method for producing the light-emitting device by a simplified procedure is provided.

In yet other exemplary embodiments of the present invention, a display device, an illuminator, and a backlight unit employing the light-emitting device are provided.

BRIEF DESCRIPTION OF THE DRAWINGS

The above and other features and advantages of the present invention will be more clearly understood from the following detailed description taken in conjunction with the accompanying drawings, in which.

DETAILED DESCRIPTION OF THE INVENTION

Figure 1:
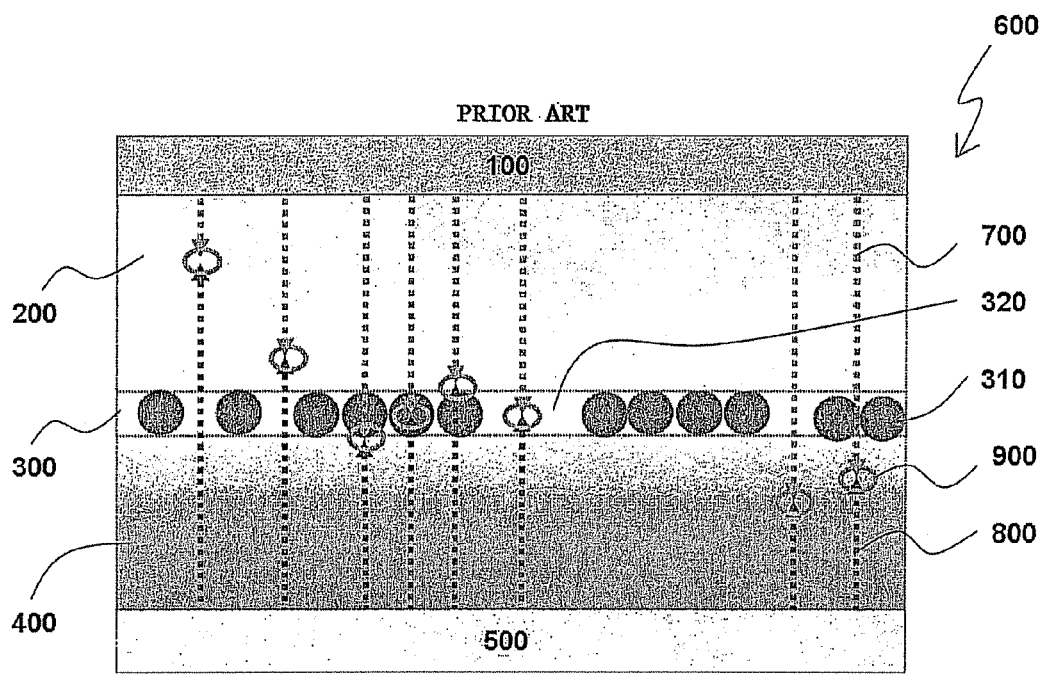
FIG. 1 is a cross-sectional view schematically showing the structure of an electroluminescence device using a nanocrystal layer with voids as a light-emitting layer.
Figure 2:
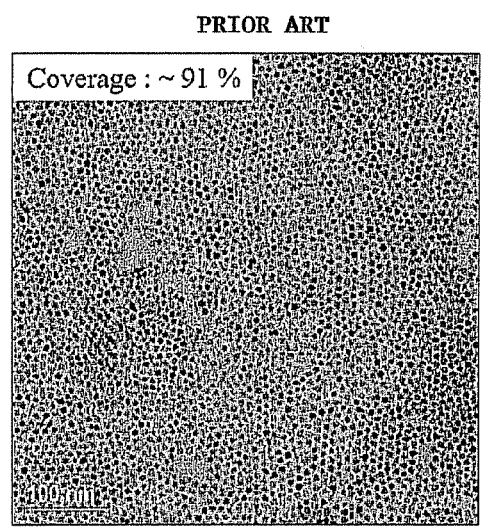
FIG. 2 is a transmission electron microscopy ("TEM") image of a PbSe thin film produced by spin coating.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the present invention will be described in detail with reference to the accompanying drawings.

In accordance with exemplary embodiments of the present invention, there is provided a light-emitting device having a hole injecting electrode (a first electrode), an electron injecting electrode (a second electrode) arranged opposite to the first electrode, and a semiconductor nanocrystal layer positioned between the first and second electrodes wherein voids formed between nanocrystal particles of the semiconductor nanocrystal layer are filled with a filling material.

The light-emitting device of the present invention may further include a hole transport layer in contact with the first electrode and an electron transport layer in contact with the second electrode.

In a preferred embodiment, the light-emitting device of the present invention includes a hole injecting electrode (a first electrode), a hole transport layer in contact with the first electrode, an electron injecting electrode (a second electrode) arranged opposite to the first electrode, an electron transport layer in contact with the second electrode, and a semiconductor nanocrystal layer positioned between the hole transport layer and the electron transport layer wherein voids formed between nanocrystal particles of the semiconductor nanocrystal layer are filled with a filling material.

The semiconductor nanocrystal layer used in the light-emitting device of the present invention can be made of any semiconductor nanocrystal that exhibits quantum confinement effects arising from its size. More specifically, the semiconductor nanocrystal is a material selected from Group II-VI compounds formed from the elements found in Groups II and VI of the periodic table of elements, Group III-V compounds formed from the elements found in Groups III and V of the periodic table of elements, Group IV-VI compounds formed from the elements found in Groups IV and VI of the periodic table of elements, Group IV compounds formed from the elements found in Group IV, and mixtures thereof. The Group II-VI compounds are selected from the group consisting of binary compounds, e.g., CdSe, CdTe, ZnS, ZnSe, ZnTe, ZnO, HgS, HgSe and HgTe, ternary compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe, and quaternary compounds, e.g., CdZnSeS, CdZnSeTe, CdZnSTe, CdHgSeS, CdHgSeTe, CdHgSTe, HgZnSeS, HgZnSeTe and HgZnSTe. The Group III-V compounds are selected from the group consisting of binary compounds, e.g., GaN, GaP, GaAs, GaSb, AlN, Alp, AlAs, AlSb, InN, InP, InAs and InSb, ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb and GaAlNP, and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb. The Group IV-VI compounds are selected from the group consisting of binary compounds, e.g., SnS, SnSe, SnTe, PbS, PbSe and PbTe, ternary compounds, e.g., SnSeS, SnSeTe, SnSTe, PbSeS, PbSeTe, PbSTe, SnPbS, SnPbSe and SnPbTe, and quaternary compounds, e.g., SnPbSSe, SnPbSeTe and SnPbSTe. The Group IV compounds are selected from the group consisting of unary compounds, e.g., Si and Ge, and binary compounds, e.g., SiC and SiGe.

When the nanocrystal layer is composed of a mixture of two or more semiconductor nanocrystals, the semiconductor nanocrystals may have a structure wherein either the nanocrystals are present at the same concentration within particles, the nanocrystals have partially divided concentration distributions within the same particle, or the nanocrystals are present in the form of alloys.

The semiconductor nanocrystal may further include an overcoating to form a core-shell structure. Materials for the overcoating may be selected from Group II-VI compounds, Group III-V compounds, Group IV-VI compounds, Group IV compounds, and mixtures thereof. The Group II-VI compounds used to form the overcoating are selected from the group consisting of binary compounds, e.g., CdSe, CdTe, ZnS, ZnSe, ZnTe, ZnO, HgS, HgSe and HgTe, ternary compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe, and quaternary compounds, e.g., CdZnSeS, CdZnSeTe, CdZnSTe, CdHgSeS, CdHgSeTe, CdHgSTe, HgZnSeS, HgZnSeTe and HgZnSTe. The Group III-V compounds are selected from the group consisting of binary compounds, e.g., GaN, GaP, GaAs, GaSb, AlN, Alp, AlAs, AlSb, InN, InP, InAs and InSb, ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb and GaAlNP, and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb. The Group IV-VI compounds are selected from the group consisting of binary compounds, e.g., SnS, SnSe, SnTe, PbS, PbSe and PbTe, ternary compounds, e.g., SnSeS, SnSeTe, SnSTe, PbSeS, PbSeTe, PbSTe, SnPbS, SnPbSe and SnPbTe, and quaternary compounds, e.g., SnPbSSe, SnPbSeTe and SnPbSTe. The Group IV compounds are selected from the group consisting of unary compounds, e.g., Si and Ge, and binary compounds, e.g., SiC and SiGe.

The voids formed between the nanocrystal particles of the semiconductor nanocrystal layer are filled with a filling material. The filling material may be an organic or inorganic insulating material.

The insulating material is particularly restricted so long as it has a resistivity of $10^4$ $\Omega \cdot cm$ or more. Suitable inorganic insulating materials can be selected from the group consisting of metal oxides, e.g., $TiO_2$, $ZnO$, $SiO_2$, $SnO_2$, $WO_3$, $ZrO_2$, $HfO_2$, $Ta_2O_5$, $BaTiO_3$, $BaZrO_3$, $Al_2O_3$, $Y_2O_3$ and $ZrSiO_4$, $Si_3N_4$, and TiN. Suitable organic insulating materials can be selected from the group consisting of polymers, e.g., epoxy resins and phenolic resins, 3-(4-biphenylyl)-4-phenyl-5-tert-butylphenyl-1,2,4-triazole (TAZ), 3,4,5-triphenyl-1,2,4-triazole, and 3,5-bis(4-tert-butylphenyl)-4-phenyl-1,2,4-triazole. While particular embodiments of inorganic and organic insulating materials have been described herein, alternative embodiments having appropriate properties may also be employed.

Since the voids of the semiconductor nanocrystal layer are filled with the filling material, a large amount of current is not concentrated on the particular sites that would otherwise be voids, thereby solving the problems of conventional light-emitting devices, such as short service life and electrical instability.

Further, since the voids of the semiconductor nanocrystal layer are filled with the filling material, the interfaces between the nanocrystal layer and its adjacent layers are simplified due to packaging effects arising from the filling, thus facilitating the fabrication of the device and enhancing the stability of the device.

The semiconductor nanocrystal layer has a monolayer structure wherein the semiconductor nanocrystal particles are arranged in a single layer. In the monolayer structure, the semiconductor nanocrystal particles are arranged in a single layer and the voids formed between the nanocrystal particles are filled with the filling material. Alternatively, the semiconductor nanocrystal layer may have a multilayer structure consisting of a plurality of monolayers, such as a plurality of the above-described monolayer structure wherein the semiconductor nanocrystal particles are arranged in a single layer within each monolayer.

The hole injecting electrode (first electrode) can be composed of at least one material selected from the group consisting of indium tin oxide (ITO), indium zinc oxide (IZO), nickel (Ni), platinum (Pt), gold (Au), silver (Ag), iridium (Ir), and oxides thereof.

The hole transport layer can be composed of an organic or inorganic material. Specific examples of suitable organic materials include, but are not limited to, poly(3,4-ethylenedioxythiophene (PEDOT)/polystyrene parasulfonate (PSS) derivatives, poly-N-vinylcarbazole derivatives, polyphenylenevinylene derivatives, polyparaphenylene derivatives, polymethaacrylate derivatives, poly(9,9-octylfluorene) derivatives, poly(spiro-fluorene) derivatives, N,N'-diphenyl-N,N'-bis 3-methylphenyl-1,1'-biphenyl-4,4'-diamine(TPD), N,N'-di(naphthalen-1-yl)-N—N'-diphenyl-benzidine, tris(3-methylphenylphenylamino)-triphenylamine (m-MTDATA), poly 9,9'-dioctylfluorene-co-N-(4-butylphenyl)diphenylamine (TFB), copper phthalocyanine, and starburst-type materials. Specific examples of suitable inorganic materials include, but are not limited to, metal oxides, e.g., $TiO_2$, ZnO, $SiO_2$, $SnO_2$ and $WO_3$, and semiconductors having a bandgap of 2.4 eV or higher, e.g., CdS, ZnSe and ZnS.

The electron injecting electrode (second electrode) can be composed of at least one material selected from the group consisting of I, Ca, Ba, Ca/Al, LiF/Ca, $BaF_2$/Al, $BaF_2$/Ca/Al, Al, Mg, and Ag/Mg alloys.

The electron transport layer can be composed of at least one material selected from organic and inorganic materials. Specific examples of suitable organic materials include, but are not limited to, oxazole, isooxazole, triazole, isothiazole, oxidiazole, thiadiazole and perylene compounds. Specific examples of suitable inorganic materials include, but are not limited to, aluminum complexes, metal oxides, e.g., $TiO_2$, ZnO, $SiO_2$, $SnO_2$, $WO_3$, $ZrO_2$, $HfO_2$, $Ta_2O_5$, $BaTiO_3$, $BaZrO_3$, $Al_2O_3$, $Y_2O_3$ and $ZrSiO_4$, and semiconductors having a bandgap 2.4 eV or higher, such as CdS, ZnSe and ZnS.

No special process is needed for the production of the light-emitting device according to the present invention, except the formation of the nanocrystal layer. The semiconductor nanocrystal can be prepared by any process commonly known in the art, but further includes the step or steps required for including the filling material in the semiconductor nanocrystal layer, as will be further described below.

A method for producing the light-emitting device of the present invention is characterized in that the voids are filled by filling them with the filling material to form the semiconductor nanocrystal layer.

Exemplary embodiments of a method for producing the light-emitting device comprising an electron transport layer and a hole transport layer arranged between electrodes according to the present invention include forming a hole injecting electrode (a first electrode); forming a hole transport layer on the first electrode; forming a semiconductor nanocrystal layer on the hole transport layer; forming an electron transport layer on the semiconductor nanocrystal layer; and forming an electron injecting electrode (a second electrode) on the electron transport layer.

The hole transport layer can be formed by coating, on the hole injecting electrode (first electrode), a dispersion of a material for forming a hole transport layer, usable in the present invention, in an organic solvent by various coating techniques, such as spin coating, casting, printing, spraying, vacuum evaporation, printing, sputtering, chemical vapor deposition ("CVD"), e-beam evaporation, etc.

The semiconductor nanocrystal layer can be formed by arranging a semiconductor nanocrystal and filling a filling material thereon, or by mixing a semiconductor nanocrystal and a filling material, as further described below.

The forming of the semiconductor nanocrystal layer can be carried out by preparing a semiconductor nanocrystal by a known process, dispersing the semiconductor nanocrystal in an organic solvent, forming the dispersion into a monolayer by a nanocrystal arrangement method, and filling a filling material on the monolayer. At this time, the monolayer can be formed by known semiconductor nanocrystal arrangement methods, including spin coating, dipping, spray coating and blade coating, and the method taught in Korean Patent Application No. 2005-0060215, herein incorporated by reference in its entirety. According to the method taught in the publication, a thin film is formed by substituting the surface of a nanocrystal to modify it, drying the modified nanocrystal under vacuum to remove an organic solvent, dispersing the dried nanocrystal in an aqueous solution, centrifuging the dispersion to remove aggregates and impurities to prepare an aqueous nanocrystal solution, and coating the aqueous nanocrystal solution by a wet coating technique, such as spin coating or dip coating.

The filling of voids with the filling material between nanocrystal particles in the nanocrystal layer can be carried out by various filling techniques known in the art, including physical vapor deposition ("PVD") and chemical vapor deposition ("CVD"). For physical vapor deposition techniques, there can be used sputtering, e-beam evaporation, thermal evaporation, laser molecular beam epitaxy, pulsed laser deposition, and the like. For chemical vapor deposition techniques, there can be used metal-organic chemical vapor deposition ("MOCVD"), hydride vapor phase epitaxy ("HVPE"), and the like.

The formation of the semiconductor nanocrystal layer using a mixture a semiconductor nanocrystal and a filling material may be carried out by surfactant pretreatment, such as surfactant exchange, surfactant insertion or polymer wrapping to fill the voids formed between the nanocrystal particles with the filling material.

Figure 3:
FIG. 3 schematically shows cross-sectional views of exemplary nanocrystal layers filled with an exemplary filling material.

When the voids formed between nanocrystal particles are filled with the filling material by filling, as described above, various methods can be employed to fill the voids to the heights shown in FIG. 3. Specifically, the filling material can fill the voids to a height equal to that of the nanocrystal particles, as shown in the leftmost portion of FIG. 3, to a lower height than that of the nanocrystal particles by filling as shown in the middle portion of FIG. 3, or to a higher height than that of the nanocrystal particles by filling while completely filling the voids as shown in the rightmost portion of FIG. 3.

When the voids are filled with the filling material to a higher height than that of the nanocrystal particles, as shown in the rightmost portion of FIG. 3, the filling material present on the nanocrystal particles preferably has a thickness of 10 nm or less so as to exert quantum effects of the nanocrystal. In terms of high luminescence efficiency of the nanocrystal, it is preferred to fill the voids with filling material to a height equal to that of the nanocrystal particles, such as shown in the middle portion of FIG. 3.

Since the voids of the semiconductor nanocrystal layer are filled with the filling material, the interfaces of the semiconductor nanocrystal layer are simplified, such as the interfaces between the semiconductor nanocrystal layer and adjacent layers or elements of the light emitting device, such as adjacent electron transport layer and hole transport layer. The simplification of such interfaces facilitates the production of the device and enhances the stability of the device.

Thereafter, the semiconductor nanocrystal layer can be annealed at a temperature of 50-120° C. An electron transport layer is formed on the semiconductor nanocrystal layer by thermal evaporation, molecular deposition or chemical deposition, and then an electron injecting electrode (a second electrode) is formed on the electron transport layer.

Figure 4A:
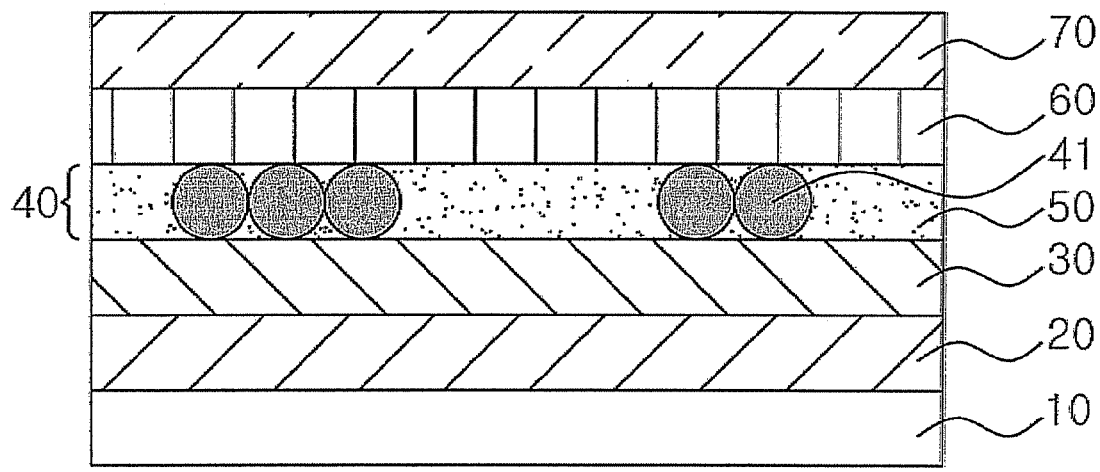
FIGS. 4A and 4B are cross-sectional views schematically showing the structure of exemplary embodiments of light-emitting devices according to the present invention.
Figure 4B:
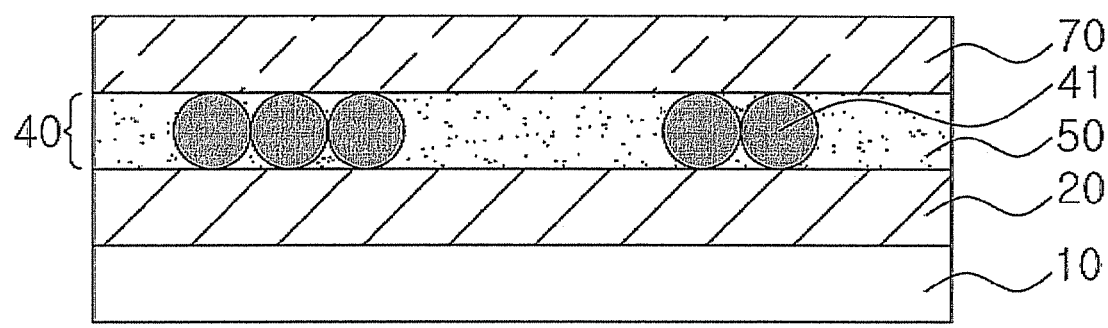

FIGS. 4A and 4B are cross-sectional views schematically showing the structure of exemplary embodiments of light-emitting devices according to the present invention.

As shown in FIG. 4A, an exemplary embodiment of a light-emitting device according to the present invention includes a transparent hole injecting electrode (a first electrode) 20 formed on a substrate 10, an electron injecting electrode (a second electrode) 70 made of a low work function metal, and a semiconductor nanocrystal layer 40 formed between the first and second electrodes 20, 70 wherein voids of the semiconductor nanocrystal layer 40 are filled with a filling material 50. The semiconductor nanocrystal layer 40 preferably has a monolayer structure wherein semiconductor nanocrystal particles 41 are uniformly arranged in a single layer. Alternatively, the semiconductor nanocrystal layer 40 has a multilayer structure comprising a plurality of monolayers.

The light-emitting device shown in FIG. 4A may further include a hole transport layer 30 formed between the hole injecting electrode (first electrode) 20 and the semiconductor nanocrystal layer 40, or an electron transport layer 60 formed between the semiconductor nanocrystal layer 40 and the electron injecting electrode (second electrode) 70. In a preferred embodiment, as shown in FIG. 4A, the light-emitting device of the present invention may have a structure wherein a hole injecting electrode (a first electrode) 20, a hole transport layer 30, a semiconductor nanocrystal layer 40 whose voids are filled with a filling material 50, an electron transport layer 60, and an electron injecting electrode (a second electrode) 70 are formed in this order on a substrate 10.

When a voltage is applied to the light-emitting device, the hole injecting electrode 20 injects holes into the hole transport layer 30 and the electron injecting electrode 70 injects electrons into the electron transport layer 60. The injected holes and electrons migrate toward the oppositely charged electrodes and are combined at the same molecules to form excitons, after which the excitons are recombined to emit light.

FIG. 4B is a cross-sectional view schematically showing the structure of another exemplary embodiment of a light-emitting device according to the present invention.

The light-emitting device shown in FIG. 4B is substantially the same as that of FIG. 4A, but without the hole transport layer 30 and the electron transport layer 60. Thus, in this case, the semiconductor nanocrystal layer 40 is interfaced directly on one surface with the hole injecting electrode 20 and on an opposite surface with the electron injecting electrode 70.

In any of the embodiments using the semiconductor nanocrystal layer 40 or alternatives thereof within the scope of these embodiments, since the light-emitting device of the present invention contains no voids, a large amount of current is not concentrated on the particular sites, thus extending the service life of the device, and occurrence of current leakage is reduced, thus improving the luminescence efficiency of the device.

Regions where excitons are recombined to emit light in the light-emitting device of the present invention may be the semiconductor nanocrystal layer 40 or the interface between the semiconductor nanocrystal layer 40 and the hole transport layer 30 or the electron transport layer 60. Optionally, the light emission may occur in both the electron transport layer 60 and the hole transport layer 30.

Depending on the luminescent properties of the semiconductor nanocrystal used for the semiconductor nanocrystal particles 41, the light-emitting device of the present invention can emit light of various colors. The light-emitting device of the present invention can emit light of a broad range of wavelengths from about 300 nm to about 3,000 nm.

Further, according to the light-emitting device of the present invention, light emitted from different luminescent materials can be mixed to achieve white light emission. That is, two kinds of semiconductor nanocrystals 41 emitting light of different wavelengths are mixed to form a semiconductor nanocrystal layer 40, thereby achieving white light emission. Alternatively, light emitted from a semiconductor nanocrystal layer 40 can be mixed with light emitted from a region other than the semiconductor nanocrystal layer 40 to obtain white light emission.

The light-emitting device of the present invention can be combined with a color filter to manufacture display devices. In addition, the light-emitting device of the present invention can used to manufacture backlight units and illuminators for a variety of devices, including any illuminatable device that may incorporate the light-emitting device of the present invention.

Hereinafter, the present invention will be further described with reference to the following examples. It should be understood that these examples are given for the purpose of illustration and are not to be construed as limiting the scope of the invention.

EXAMPLE 1

Fabrication of Light-Emitting Device Including Nanocrystal Layer Whose Voids are Filled with Filling Material A $TiO_2$ precursor (DuPont Tyzor, BTP, 2.5 wt % in butanol) was spin-coated on a patterned ITO substrate at 2,000 rpm under a nitrogen atmosphere for 30 seconds, dried under a nitrogen atmosphere for about 5 minutes, and annealed at 150° C. for 15 minutes to form an amorphous $TiO_2$ thin film having a thickness of about 20 nm.

Figure 5:
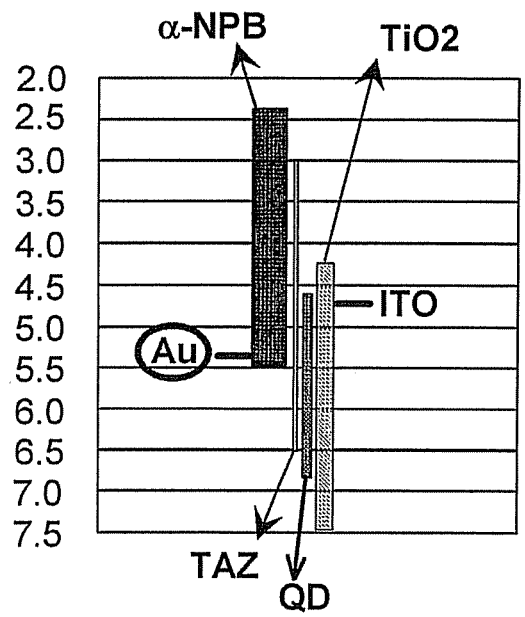
FIG. 5 is a diagram showing the energy bandgaps of a light-emitting device produced in Example 1 of the present invention.

A solution (0.3 wt %) of red-emitting (642 nm) CdSe/ZnS core/shell structured quantum dots QD (diameter: about 6 nm, Evident Tech. Inc.) in chloroform was spin-coated on the $TiO_2$ thin film at 2,000 rpm for 30 seconds, and dried at 50° C. for 5 minutes to arrange the quantum dots QD in a single layer. 3-(4-biphenyl)-4-phenyl-5-tert-butylphenyl-1,2,4-triazole (TAZ) was filled on the quantum dots QD to form a semiconductor nanocrystal layer. N,N'-di(naphthalen-1-yl)-N—N'-diphenyl-benzidine (a-NPB) was filled to a thickness of about 40 nm on the semiconductor nanocrystal layer using a thermal evaporator in a glove box. Finally, Au was filled to a thickness of about 100 nm using a patterned mask to form an electrode, completing the production of a light-emitting device. The device was sealed using encap glass to protect it against oxygen and moisture. The energy bandgaps of the light-emitting device are shown in FIG. 5.

COMPARATIVE EXAMPLE 1

Fabrication of Light-Emitting Device Comprising Nanocrystal Layer Having Voids

Figure 6:
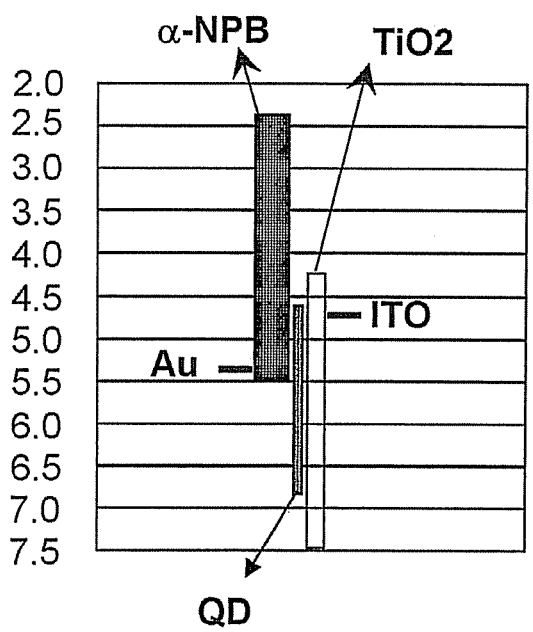
FIG. 6 is a diagram showing the energy bandgaps of a light-emitting device produced in Comparative Example 1 of the present invention.

A light-emitting device was produced in the same manner as in Example 1, except that the triazole derivative (TAZ) was not filled after the quantum dots QD were arranged in a single layer to form a semiconductor nanocrystal layer. The energy bandgaps of the light-emitting device are shown in FIG. 6.

EXPERIMENTAL EXAMPLE 1

Comparison of Stability of Light-Emitting Devices

To evaluate the stability of the light-emitting devices produced in Example 1 and Comparative Example 1, the luminescence spectra, luminescence intensity per unit area, and changes in the amount of current flowing through the devices were measured at ambient temperature and pressure with increasing voltage applied to the devices.

Figure 7A:
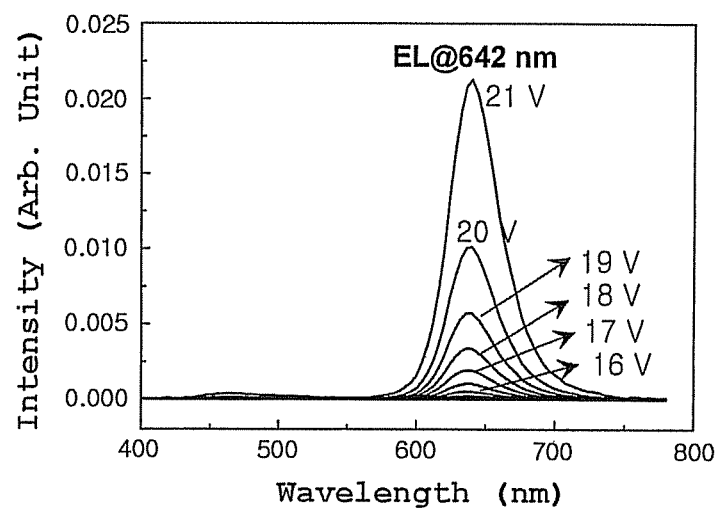
FIGS. 7A and 7B are graphs showing luminescence spectra of light-emitting devices produced in Example 1 and Comparative Example 1 of the present invention, respectively, with increasing voltage applied to the devices.
Figure 7B:
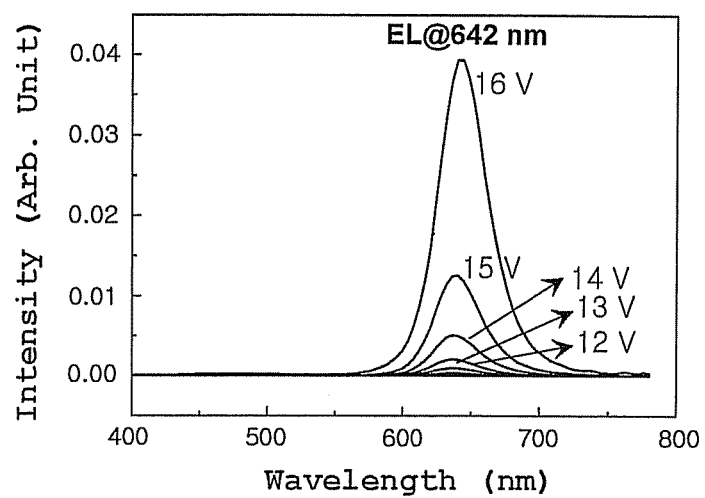

FIGS. 7A and 7B are graphs showing luminescence spectra of the light-emitting devices produced in Example 1 and Comparative Example 1, respectively, with increasing voltage applied to the devices.

Figure 8A:
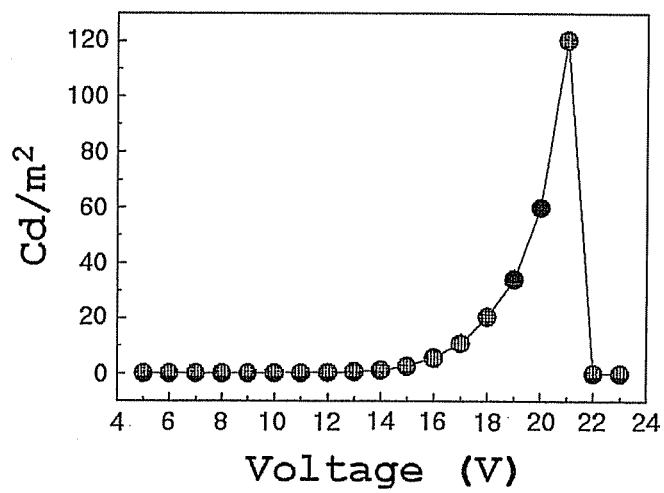
FIGS. 8A and 8B are graphs showing changes in luminescence intensity per unit area of light-emitting devices produced in Example 1 and Comparative Example 1 of the present invention, respectively, with increasing voltage applied to the devices.
Figure 8B:
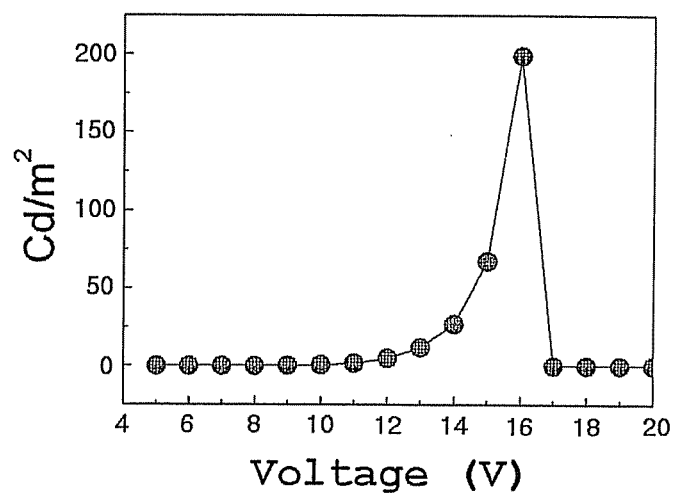

FIGS. 8A and 8B are graphs showing changes in luminescence intensity per unit area of the light-emitting devices produced in Example 1 and Comparative Example 1, respectively, with increasing voltage applied to the devices.

These graphs show that the intensity of light emitted from the light-emitting devices increases with increasing voltage applied to the devices.

Figure 9A:
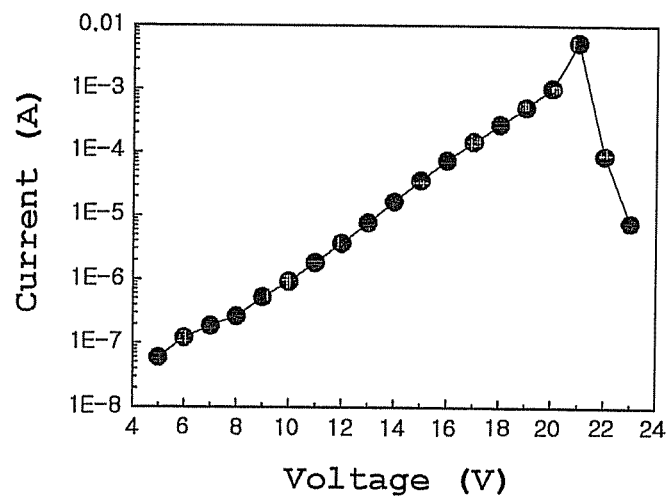
FIGS. 9A and 9B are graphs showing changes in the amount of current flowing through light-emitting devices produced in Example 1 and Comparative Example 1 of the present invention, respectively, with increasing voltage applied to the devices; and, FIGS. 10A and 10B are graphs showing changes in luminescence efficiency per unit current of light-emitting devices produced in Example 1 and Comparative Example 1 of the present invention, respectively, with increasing voltage applied to the devices.
Figure 9B:
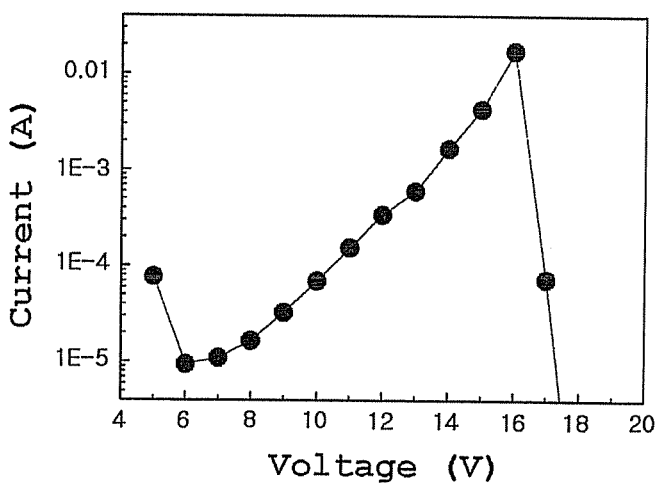

FIGS. 9A and 9B are graphs showing changes in the amount of current flowing through the light-emitting devices produced in Example 1 and Comparative Example 1, respectively, with increasing voltage applied to the devices.

The graph of FIG. 9B shows that the amount of current flowing through the light-emitting device produced in Comparative Example 1 increases with increasing voltage until it reaches a maximum at 16V and thereafter drastically drops down to near zero after 18V. In contrast, the graph of FIG. 9A shows that the amount of current flowing through the light-emitting device produced in Example 1 increases with increasing voltage until it reaches a maximum at 21V and thereafter slightly drops but is maintained at a constant level without further dropping. These results indicate that a large amount of current collected in the voids of the light-emitting device produced in Comparative Example 1 destroys the device to cause rapid current leakage from the device, while a large amount of current is not collected in voids of the light-emitting device produced in Example 1, because such voids are filled, and thus slow current leakage occurs.

EXPERIMENTAL EXAMPLE 2

Comparison of Luminescence Efficiency of Light-Emitting Devices

To measure the luminescence efficiency of the light-emitting devices produced in Example 1 and Comparative Example 1, the luminescence intensity per unit current of the devices was measured at ambient temperature and pressure with increasing voltage applied to the devices.

Figure 10A:
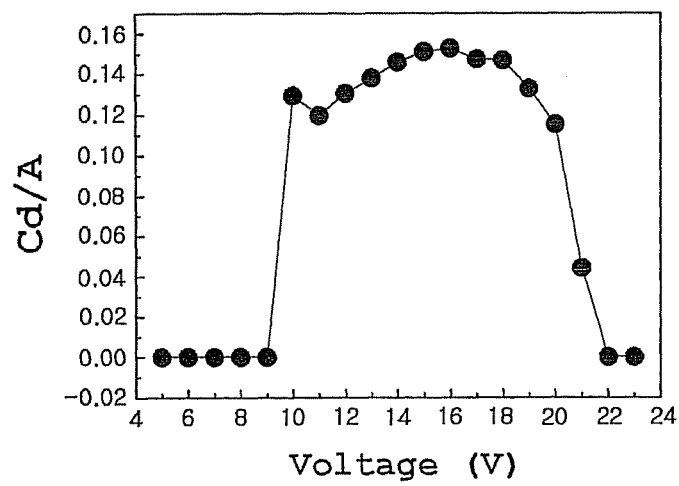
Figure 10B:
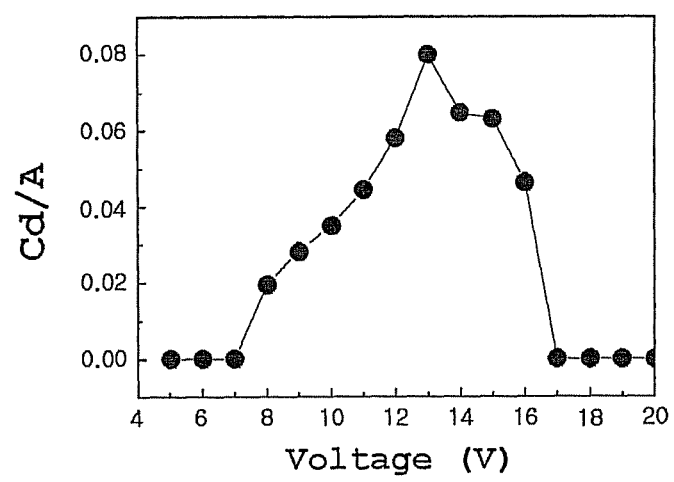

FIGS. 10A and 10B are graphs showing changes in luminescence efficiency per unit current of the light-emitting devices produced in Example 1 and Comparative Example 1, respectively, with increasing voltage applied to the devices.

The graph of FIG. 10B shows that the luminescence efficiency per unit current of the light-emitting device produced in Comparative Example 1 gradually increases until it reaches a maximum at 13V and thereafter begins to rapidly decrease. In contrast, the graph of FIG. 10A shows that the luminescence efficiency of the light-emitting device produced in Example 1 is maintained at a high level from the beginning of light emission until 21V and thereafter decreases. These results reveal that the light-emitting device produced in Example 1 stably exhibits high luminescence efficiency, compared to the device having voids produced in Comparative Example 1.

As apparent from the foregoing, according to the exemplary embodiments of the light-emitting device of the present invention, since voids formed between nanocrystal particles of a semiconductor nanocrystal layer are filled with a filling material, the occurrence of a current leakage through the voids is minimized and thus the amount of an operating current is reduced, thereby enabling the device to have extended service life and high luminescence efficiency.

In addition, according to the method of the present invention, since the voids of the semiconductor nanocrystal layer are filled with a filling material, the interfaces between the nanocrystal layer and its adjacent layers are simplified, which facilitates the production of the device and enhances the stability of the device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A light-emitting device, comprising:
a first electrode;
a second electrode arranged opposite to the first electrode; and
a semiconductor nanocrystal layer positioned between the first and second electrodes,
wherein the semiconductor nanocrystal layer includes a monolayer structure in which semiconductor nanocrystal particles are arranged in a single layer, and
voids formed between semiconductor nanocrystal particles of the semiconductor nanocrystal layer, the voids are filled with a filling material to a height equal to or lower than that of the semiconductor nanocrystal particles; the filling material being electrically insulating; where the electrically insulating material is selected from the group consisting of $ZrO_2$, $HfO_2$, $Ta_2O_5$, $BaTiO_3$,

$BaZrO_3$, $Y_2O_3$, $ZrSiO_4$, $Si_3N_4$, TiN, and a combination comprising at least one of the foregoing insulating materials.

2. The light-emitting device of claim 1, wherein the first electrode is a hole injecting electrode and the second electrode is an electron injecting electrode.

3. The light-emitting device according to claim 1, further comprising a hole transport layer in contact with the first electrode and an electron transport layer in contact with the second electrode.

4. The light-emitting device according to claim 1, wherein the semiconductor nanocrystal layer includes a material selected from Group II-VI compounds, Group III-V compounds, Group IV-VI compounds, Group IV compounds, and mixtures thereof.

5. The light-emitting device according to claim 1, wherein the semiconductor nanocrystal layer further includes an overcoating made of at least one material selected from Group II-VI compounds, Group III-V compounds, Group IV-VI compounds, Group IV compounds, and mixtures thereof.

6. The light-emitting device according to claim 3, wherein the hole transport layer is composed of material selected from the group consisting of poly(3,4-ethylenedioxythiophene) (PEDOT)/polystyrene parasulfonate (PSS) derivatives, poly-N-vinylcarbazole derivatives, polyphenylenevinylene derivatives, polyparaphenylene derivatives, polymethacrylate derivatives, poly(9,9-octylfluorene) derivatives, poly(spirofluorene) derivatives, N,N'-diphenyl-N,N'-bis 3-methylphenyl-1,1'-biphenyl-4,4'-diamine (TPD), N,N'-di(naphthalen-1-yl)-N—N'-diphenyl-benzidine, tris(3-methylphenylphenylamino)-triphenylamine (m-MTDATA), poly 9,9'-dioctylfluorene-co-N-(4-butylphenyl)diphenylamine (TFB), copper phthalocyanine, metal oxides, including $TiO_2$, ZnO, $SiO_2$, $SnO_2$, $WO_3$, $ZrO_2$, $HfO_2$, $Ta_2O_5$, $BaTiO_3$, $BaZrO_3$, $Al_2O_3$, $Y_2O_3$ and $ZrSiO_4$, and semiconductors having a bandgap of 2.4 eV or higher, including CdS, ZnSe and ZnS.

7. The light-emitting device according to claim 3, wherein the electron transport layer is composed of a material selected from the group consisting of oxazole compounds, isooxazole compounds, triazole compounds, isothiazole compounds, oxidiazole compounds, thiadiazole compounds, perylene compounds, aluminum complexes, metal oxides, including $TiO_2$, ZnO, $SiO_2$, $SnO_2$, $WO_3$, $ZrO_2$, $HfO_2$, $Ta_2O_5$, $BaTiO_3$, $BaZrO_3$, $Al_2O_3$, $Y_2O_3$ and $ZrSiO_4$, and semiconductors having a bandgap 2.4 eV or higher, such as CdS, ZnSe and ZnS.

8. The light-emitting device of claim 1, wherein the semiconductor nanocrystal particles are quantum dots.

9. An illuminatable device comprising:
a light-emitting device, the light emitting device including
a first electrode;
a second electrode arranged opposite to the first electrode; and
a semiconductor nanocrystal layer positioned between the first and second electrodes,
wherein the semiconductor nanocrystal layer includes a monolayer structure in which semiconductor nanocrystal particles are arranged in a single layer, and voids formed between semiconductor nanocrystal particles of the semiconductor nanocrystal layer, the void are filled with a filling material to a height equal to or lower than that of the semiconductor nanocrystal particles; where the filling material is electrically insulating; where the electrically insulating material is selected from the group consisting of $ZrO_2$, $HfO_2$, $Ta_2O_5$, $BaTiO_3$, $BaZrO_3$, $Y_2O_3$, $ZrSiO_4$, $Si_3N_4$, TiN, and a combination comprising at least one of the foregoing insulating materials.

10. The device of claim 9, wherein the device is a display device.

11. The device of claim 9, wherein the device is an illuminator.

12. The device of claim 9, wherein the device is a backlight unit.

13. A method for producing a light-emitting device having a semiconductor nanocrystal layer positioned between a pair of electrodes, the method comprising:
arranging semiconductor nanocrystal particles into a monlayer structure having a single layer to form the semiconductor nanocrystal layer; and
filling voids formed between semiconductor nanocrystal particles of the semiconductor nanocrystal layer with a filling material to a height equal to or lower than that of the semiconductor nanocrystal particles; where the filling material is electrically insulating; where the electrically insulating material is selected from the group consisting of $ZrO_2$, $HfO_2$, $Ta_2O_5$, $BaTiO_3$, $BaZrO_3$, $Y_2O_3$, $ZrSiO_4$, $Si_3N_4$, TiN, and a combination comprising at least one of the foregoing insulating materials.

14. The method according to claim 13, wherein filling voids includes filling voids formed between semiconductor nanocrystal particles in the semiconductor nanocrystal layer with the filling material by surfactant pretreatment.

15. The method according to claim 13, wherein filling with a filling material includes physical vapor deposition or chemical vapor deposition.

16. The method according to claim 13, wherein the semiconductor nanocrystal particles are quantum dots.

* * * * *